(12) United States Patent
Johnson et al.

(10) Patent No.: US 10,466,398 B2
(45) Date of Patent: Nov. 5, 2019

(54) OPTICAL STACK INCLUDING REFLECTING-ABSORBING POLARIZER

(71) Applicant: 3M INNOVATIVE PROPERTIES COMPANY, St. Paul, MN (US)

(72) Inventors: Matthew B. Johnson, Woodbury, MN (US); Adam D. Haag, Woodbury, MN (US); Seong Taek Lee, Woodbury, MN (US); Brianna N. Nieson, Bloomington, MN (US); Kristy A. Gillette, Spring Valley, WI (US); Michelle L. Toy, North Saint Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 20 days.

(21) Appl. No.: 15/737,043

(22) PCT Filed: Jun. 13, 2016

(86) PCT No.: PCT/US2016/037244
§ 371 (c)(1),
(2) Date: Dec. 15, 2017

(87) PCT Pub. No.: WO2016/205130
PCT Pub. Date: Dec. 22, 2016

(65) Prior Publication Data
US 2018/0172888 A1    Jun. 21, 2018

Related U.S. Application Data

(60) Provisional application No. 62/175,527, filed on Jun. 15, 2015.

(51) Int. Cl.
*G02B 5/30* (2006.01)
*G02B 5/22* (2006.01)
(Continued)

(52) U.S. Cl.
CPC ............. *G02B 5/305* (2013.01); *G02B 5/223* (2013.01); *G02B 5/3041* (2013.01);
(Continued)

(58) Field of Classification Search
CPC ...... G02B 5/305; G02B 5/223; G02B 5/3041; G02B 6/0056; G02F 1/133536; H01L 27/3244
(Continued)

(56) References Cited

U.S. PATENT DOCUMENTS

| 4,895,769 A | 1/1990 | Land |
| 5,066,108 A | 11/1991 | McDonald |

(Continued)

FOREIGN PATENT DOCUMENTS

| WO | WO 2014-130283 | 8/2014 |
| WO | WO 2015-085114 | 6/2015 |

OTHER PUBLICATIONS

International Search Report for PCT International Application No. PCT/US2016/037244, dated Sep. 16, 2016, 4 pages.

(Continued)

*Primary Examiner* — Frank G Font
(74) *Attorney, Agent, or Firm* — Robert S. Moshrefzadeh (57) ABSTRACT

Optical stacks are described. In particular, optical stacks including reflecting-absorbing polarizers and quarter-wave plates are disclosed. The optical core of the optical stack—which includes a reflecting-absorbing polarizer with at least one skin layer including polarizing dye—may be co-extruded or co-stretched.

19 Claims, 2 Drawing Sheets

(51) Int. Cl.
*G02F 1/335* (2006.01)
*H01L 27/32* (2006.01)
*G02F 1/1335* (2006.01)
*F21V 8/00* (2006.01)

(52) U.S. Cl.
CPC .... *G02F 1/133536* (2013.01); *H01L 27/3244* (2013.01); *G02B 6/0056* (2013.01)

(58) Field of Classification Search
USPC .................................. 359/487.02, 492.01
See application file for complete search history.

(56) References Cited

U.S. PATENT DOCUMENTS

| | | | |
|---|---|---|---|
| 6,096,375 | A | 8/2000 | Ouderkirk |
| 6,179,948 | B1 | 1/2001 | Merrill |
| 6,451,414 | B1 * | 9/2002 | Wheatley .......... B32B 17/10018 359/359 |
| 6,549,335 | B1 | 4/2003 | Trapani |
| 6,841,803 | B2 | 1/2005 | Aizawa |
| 6,936,960 | B2 | 8/2005 | Cok |
| 7,651,643 | B2 | 1/2010 | Saiki |
| 7,826,009 | B2 * | 11/2010 | Weber .................. G02B 27/281 349/96 |
| 8,072,683 | B2 * | 12/2011 | Tan ........................ G02B 5/305 359/489.16 |
| 8,148,894 | B2 | 4/2012 | Park |
| 8,338,823 | B2 | 12/2012 | Kim |
| 2002/0180916 | A1 | 12/2002 | Schadt |
| 2003/0028048 | A1 | 2/2003 | Cherkaoui |
| 2004/0135499 | A1 | 7/2004 | Cok |
| 2005/0072959 | A1 | 4/2005 | Moia |
| 2006/0176422 | A1 | 8/2006 | Jeng |
| 2007/0047080 | A1 | 3/2007 | Stover |
| 2007/0085476 | A1 | 4/2007 | Hirakata |
| 2008/0049184 | A1 * | 2/2008 | Tan ........................ G02B 5/305 349/191 |
| 2008/0151147 | A1 * | 6/2008 | Weber .................... G02B 5/305 349/96 |
| 2008/0151371 | A1 * | 6/2008 | Weber .................. G02B 27/281 359/487.02 |
| 2010/0110553 | A1 * | 5/2010 | Anderson ............... B60R 1/088 359/603 |
| 2011/0102891 | A1 | 5/2011 | Derks |
| 2015/0146166 | A1 * | 5/2015 | Weber .................... G02C 7/107 351/159.62 |
| 2016/0306086 | A1 * | 10/2016 | Haag .................. G02B 5/3041 |

OTHER PUBLICATIONS

Denker, Invited Paper 45.1, "Advanced Polarizer Film for Improved Performance of Liquid Crystal Displays,", Presented at Society for Information Displays (SID) International Conference in San Francisco, Calif., Jun. 4-9, 2006, 3 pages.

* cited by examiner

OPTICAL STACK INCLUDING REFLECTING-ABSORBING POLARIZER

CROSS REFERENCE TO RELATED APPLICATIONS

This application is a national stage filing under 35 U.S.C. 371 of PCT/US2016/037244, filed Jun. 13, 2016, which claims the benefit of Provisional Application No. 62/175,527, filed Jun. 15, 2015, the disclosure of which is incorporated by reference in their entirety herein.

BACKGROUND

Reflecting-absorbing polarizers may be reflective polarizers that include polarization-selective light absorbing elements, such as dichroic dyes. These polarizers may combine the functionality of a reflective polarizer and an absorbing polarizer. In emissive displays, such as organic light emitting diode displays (OLED displays) the emissive display panel may have a highly reflective back substrate, reducing contrast in ambient viewing conditions. Circular absorbing polarizers are typically included in these displays to reduce the reflection of ambient light. These polarizers are often thick and provide noticeable color artifacts when viewed off angle.

SUMMARY

In one aspect, the present description relates to an optical stack. In particular, the optical stack includes an optical core having a top surface and a bottom surface, the optical core including a reflecting-absorbing polarizer having at least one skin layer positioned nearer the top surface than the bottom surface, the at least one skin layer including polarizing dye. The optical stack also includes a quarter-wave plate disposed directly on the bottom surface of the optical core. The optical stack contains no polarizing-selecting elements outside of the optical core.

DETAILED DESCRIPTION

Figure 1:
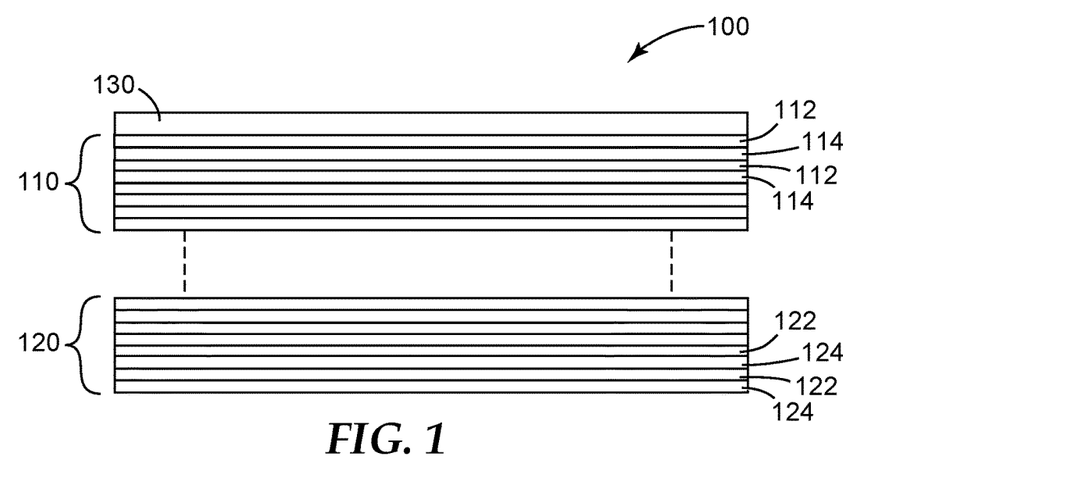
FIG. 1 is an exploded elevation cross section of a reflecting-absorbing polarizer.

FIG. 1 is an exploded elevation cross section of a reflecting-absorbing polarizer. Reflecting-absorbing polarizer 100 includes hybrid polarizer portion 110 including alternating layers of high index layer 112 and low index layer 114, and reflective polarizer portion 120 including alternating layers of high index layer 122 and low index layer 124. Reflecting absorbing polarizer 100 also includes skin layer 130. Hybrid polarizer portion 110 and reflective polarizer portion 120 are shown as connected with dashed lines to represent that they are typically connected as a single film; however, they are represented spatially separated for ease of illustration and identification of their constituent parts.

In the configuration shown in FIG. 1, hybrid polarizer portion 110 may be a multilayer reflective polarizer. In some embodiments, the multilayer reflective polarizer includes thermoplastic birefringent layers. Within hybrid polarizer portion 110, at least some instances of high index layer 112 may include absorbing polarizing elements. These absorbing polarizing elements may be any suitable material that absorbs light of one polarization in favor of light having another polarization. In some cases these materials may be referred to as dichroic. In some embodiment, these absorbing polarizing elements may be dyes, including, for example, dichroic dyes. In some cases, all of the instances of high index layer 112 may include absorbing polarizing elements. In some embodiments, the dyes or absorbing polarizing elements may be orientable, that is, when stretched, the absorbing polarizing elements may preferentially absorb polarizations that are parallel to the stretch direction. If the layers include orientable thermoplastic layers, the thermoplastic layers may be oriented (i.e., stretched) in the same step as orienting the absorbing polarizing elements. Depending on whether the materials of the thermoplastic layers are positively or negatively birefringent; that is, whether the index of refraction increases or decreases along the stretch direction, the block axis attributed to the birefringence in the alternating layers may be parallel or perpendicular to the block axis attributed to the absorbing polarizing elements. Low index layer 114 is instead substantially free of absorbing polarizing elements. Hybrid polarizer portion 110 both reflects certain polarizations of light due to its in-plane refractive index differences and absorbs certain polarizations of light due to its absorbing polarizing elements.

Reflective polarizer portion 120 may also be a multilayer reflective polarizer. The high index and low index layers of reflective polarizer portion 120 are substantially free of any absorbing polarizing elements. In some embodiments, reflective polarizer portion 120 may be in many aspects substantially the same film or have substantially the same properties as hybrid polarizer portion 110. For example, reflective polarizer portion 120 and hybrid polarizer portion 110 may have the same or similar layer counts, total thicknesses, layer thickness profiles, and may use similar material sets. Because hybrid polarizer portion 110 contains absorbing polarizing elements, however, hybrid polarizer portion 110 and reflective polarizer portion 120 will never be absolutely identical. In some embodiments, the layer count, layer thickness profiles, packet number and configuration, and material sets may be different between the hybrid polarizer portion and reflective polarizer portion. In some embodiments, the layer profiles of each packet may be specifically designed to optimize collimation or otherwise selectively reflect high angle light preferentially transmit light within a desired angular range.

Hybrid polarizer portion 110 is disposed on reflective polarizer portion 120. In some embodiments, hybrid polarizer portion 110 is laminated or adhered to reflective polarizer portion by any suitable attachment method, including optically clear adhesives, pressure sensitive adhesives, or the like. Any adhesive may in some embodiments have an index of refraction close to that of adjacent layers of both the hybrid polarizer portion 110 and reflective polarizer portion 120 to avoid or minimize refractive or Fresnel reflection effects. In some embodiments hybrid polarizer portion 110 and reflective polarizer portion 120 are optically coupled. In some embodiments, hybrid polarizer portion 110 is coextruded with reflective polarizer portion 120, and hybrid polarizer portion 110 and reflective polarizer portion 120 may be separated by a thicker non-optical layer, such as a protective boundary layer (PBL). In some embodiments, hybrid polarizer portion 110 and reflective polarizer portion 120 are separated by a thick or dimensionally stable layer to improve warp resistance or other physical characteristics.

Skin layer 130 is disposed on hybrid polarizer portion 110, and, more particularly, on an external surface of reflecting-absorbing polarizer 100. The skin layer, in some embodiments, is coextruded and costretched with the rest of reflecting-absorbing polarizer 100. Skin layer 130 may be thicker than any of the alternating high index layers 112 or low index layers 114. In some embodiments, skin layer 13 may be between 0.5 µm or 15 µm. Skin layer 130 may include polarizing dye. In some embodiments, skin layer 130 includes a similar dye loading (by volume) compared with the high index layers including polarizing dye within hybrid polarizer portion 110. In some embodiments the dye loading may be higher or lower. In some embodiments, an additional skin layer may be provided on the opposite surface of the reflecting-absorbing polarizer.

In some embodiments, reflecting-absorbing polarizer 100 includes hybrid polarizer portion 110 but not reflective polarizer portion 120. In other words, the reflecting-absorbing polarizer may be a single packet configuration, where absorbing polarizing elements are present in all of the high index layers.

Figure 2:
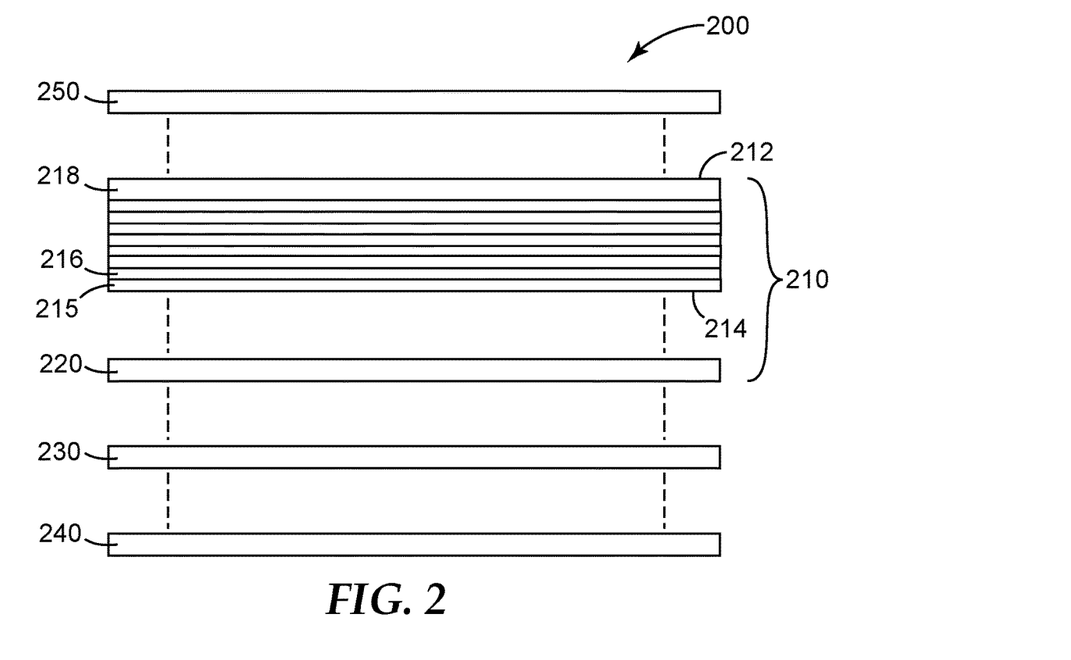
FIG. 2 is an exploded elevation cross section of an optical stack including a reflecting-absorbing polarizer.

FIG. 2 is an exploded elevation cross section of an optical stack including a reflecting-absorbing polarizer. Optical stack 200 includes optical core 210 having top surface 212 and bottom surface 214. Optical core 210 includes a reflecting-absorbing polarizer with alternating layers 215 and 216 and skin layer 218. The reflecting-absorbing polarizer may also include an optional additional layer 220. Quarter-wave plate 230 is disposed directly on the bottom surface of the optical core. Optionally, optical stack 200 includes bottom protective layer 240 and top protective layer 250.

Optical core 210 may be or may essentially be a reflecting-absorbing polarizer. In this embodiment, the reflecting absorbing polarizer includes alternating low index layers 215 and high index layers 216. In some embodiments, the reflecting-absorbing polarizer may have a dual-packet configuration as shown in FIG. 1, or it may have a single packet configuration as described elsewhere. In any event, at least some of high-index layers 216 include polarizing dyes. Optical core 210 has a top surface 212 and a bottom surface 214 which may or may not be coincident with the top and bottom surfaces of the reflecting-absorbing polarizer. Optical core 210 further includes top skin layer 218, which, as described in conjunction with the exemplary reflecting-absorbing polarizer configuration in FIG. 1, includes polarizing dyes. In some embodiments, optional additional layer 220 is included.

In some embodiments, optional additional layer 220 is an additional skin layer. The skin layer may or may not include polarizing dyes. In terms of composition, thickness, and other physical properties, this additional skin layer may be similar to or different from skin layer 218. In some embodiments, optional additional layer 220 is an immiscible blend of two polymers, where at least one of the polymers is capable of developing birefringence when stretched. For example, optional additional layer 220 may be a diffuse reflective polarizing layer, such as those described in U.S. Pat. No. 6,179,948.

In some embodiments, optional additional layer 220 is an adhesive. In some embodiments, optional additional layer 220 is a pressure sensitive and/or optically clear adhesive. Further, and as its name implies, in some embodiments, optical stack 200 may not include optional additional layer 220 at all. For this reason, bottom surface 214 may be, in some embodiments, where it is illustrated in FIG. 2, but may be, in other embodiments, on the bottom surface of optional additional layer 220 (instead of on the bottom surface of one of the alternating high or low index layers).

The optical core may be coextruded and cast together, as from a feedblock, for example. In some embodiments, one or more layers may be coated or laminated after extrusion, and stretched together. These processes may provide excellent material uniformity and consistency throughout the film and make the challenge of laminating layers such that the optical axes are properly aligned a non-issue.

Quarter-wave plate 230 is directly disposed on bottom surface 214 of optical core 210. Quarter-wave plate 230 is configured to selectively retard incident light to convert it from linearly polarized light to circularly polarized light (or elliptically polarized light) or vice versa. As is conventional, the quarter-wave plate is disposed such that its slow axis at a 45 degree angle from the transmission axis of the adjacent polarizing elements, which may be optional additional layer 220 configured as a diffuse reflective polarizer or the reflecting-absorbing polarizer included in optical core 210.

Quarter-wave plate 230 may be any suitable construction. Generally, a quarter-wave plate includes a layer of a birefringent material. In some embodiments, quarter-wave plate 230 is liquid crystal polymer coated on a film or substrate, such as a cyclo-olefin polymer substrate, cellulose triacetate (triacetyl cellulose, TAC), or polycarbonate. In some embodiments, as depicted in FIG. 1, quarter-wave plate 230 may have a slow axis oriented substantially 45° to the transmission axis of the reflecting-absorbing polarizer included in optical core 210. For the purposes of this application, an orientation of substantially 45° and substantially 135° may be considered substantially equivalent as between two axes, given the bidirectional nature of a transmission axis. However, substantially 45° and substantially 135° may be used, when comparing three or more axes, to distinguish two axes that may be oriented 90° to one another. Substantially 45° also may be understood to not be limited to precisely 45°; instead, the alignment of the axes may be within 10°, within 50, or within 10 of 45°. Alignment may in some cases be a tradeoff between manufacturability (e.g., error tolerance) and optical performance, the appropriate balance being determined depending on the desired application. Nonetheless, precise alignment may not in fact be crucial in many applications. For purposes of this application, the terms plate, retarder and retardation layer are used interchangeably.

In some cases quarter-wave plate 230 may be achromatic. In other words, quarter-wave plate 230 may rotate or modulate polarization the same, independent of the wavelength of incident light.

Achromatic quarter-wave plate may be used in some embodiments to compensate for the non-linear wavelength-dependent modulation of light in a conventional quarter-wave retardation layer, making the transmission instead relatively flat, linear, or in conformance with or approaching any desired spectrum. This may minimize or eliminate shifts in color or other artifacts. In some embodiments the desired achromaticity may be achieved through designing or selecting certain wavelength-specific retardance. For example, the achromatic quarter-wave retarder may have a retardance (i.e., difference in path length of one of the orthogonal field components of incident light) of 100 nm for 400 nm light and 200 nm for 800 nm light (corresponding to a quarter a wavelength). However, precise linear achromaticity is not necessary in some embodiments, and therefore the actual retardance values may be within 10%, within 7.5%, within 5%, or within 2% of the quarter wavelength value.

In some embodiments, the reflecting-absorbing polarizer may be turned, through judicious selection of materials and layer thickness of optical repeat units, to compensate for the wavelength-dependent modulation of a conventional quarter-wave retardation layer. In other words, the tuned reflective polarizer may be tuned to compensate for or reduce the perceived effect of wavelength dispersion of the quarter-wave retardation layer. The optical thickness (physical thickness multiplied by the refractive index of a material) of each set of microlayers, called an optical repeat unit, reflects light at wavelengths about twice its optical thickness through constructive interference. In designing a tuned reflective polarizer, the arrangement of these layers may be utilized to provide greater or lesser reflection based on wavelength.

Bottom protective layer 240 and top protective layer 250 are optionally included in optical stack 210 and may have similar compositions and properties or they may be different. Although characterized as protective layers, they may serve other functions instead of or in addition to protection of the layers of the optical stack. For example, one or more of the protective layers may include a surface or bulk diffuser. Any appropriate diffusing structure may be used. In some embodiments, bottom protective layer 240 or top protective layer 250 include a microreplicated surface structure that provides surface scattering. In some embodiments, the protective layers include particles or beads that provide bulk or volume scattering. In some embodiments, both types of scattering are provided by the protective layers, sometimes in a single layer.

In some embodiments, the protective layers may impart warp, thermal, or scratch/abrasion resistance, or they may provide any other physical or environmental advantage or characteristic to optical stack 210. In some embodiments, the protective layers may provide anti-wetout, anti-Newton ring, or slip characteristics. One or both of the protective layers may be peelable or strippable, which may provide beneficial handling characteristics to the film through the manufacturing, converting, and assembling process. In some embodiments, the protective layers may be, include, or function as hardcoat layers, with any suitable or desirable pencil hardness, for example.

Conventional circular absorbing polarizers usually include generally thick dye-stained polyvinyl alcohol (PVA) carrier layers. At least one TAC layer is also often utilized in order to protect against degradation of the stained layer. These layers may add about 50-75 micrometers of thickness, if not more.

Figure 3:
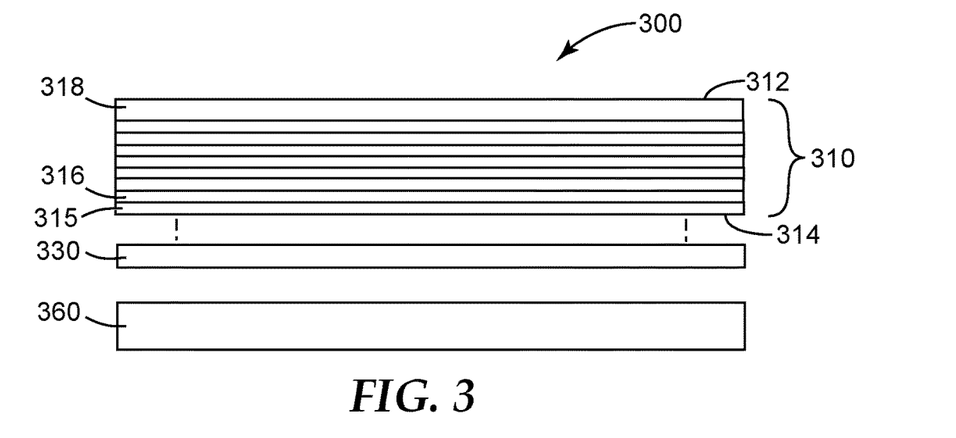
FIG. 3 is a cross section of an emissive display including an optical stack including a reflecting-absorbing polarizer.

FIG. 3 is a cross section of an emissive display including an optical stack including a reflecting-absorbing polarizer. Emissive display 300 includes optical core 310 with top surface 312 and bottom surface 314 and including alternating layers 315 and 316 and skin layer 318. Quarter wave plate 330 is disposed directly on bottom surface 314 of optical core 310. Emissive display panel 360 is disposed nearer bottom surface 314 than top surface 312.

Emissive display panel 360 may be any suitable emissive display panel. Emissive display panel 360 may be full color or, in some embodiments, emissive display panel 360 may be monochrome. In some embodiments, emissive display panel 360 includes one or more light emitting diodes (LEDs). In some embodiments, the emissive display panel may include one or more organic light emitting diodes (OLEDs). In some embodiments, the emissive display panel may include a plasma display. These emissive elements may produce light of any wavelength or any combination of wavelengths. In some embodiments, the wavelengths generated by the emissive materials may be selected to appear white or, through combinations of colors, to reproduce to a human observer an appropriately wide color gamut. Emissive display panels are distinguished by non-emissive display panels in that emissive display panels display an image substantially directly; in other words any image from emissive display 300 is substantially related to the image pattern on the emissive display panel. Non-emissive panels, such as a typical liquid crystal display (LCD) panel, use selective light gating through electrical control of the liquid crystal material to form images from otherwise substantially uniformly illuminated backlights.

Emissive display panel 360 should be understood to also include all appropriate and suitable driving electronics. In some embodiments, emissive display panel 360 may be an active-matrix OLED, or AMOLED system.

The other components in emissive display 300 shown in FIG. 3 are as described in, for example, FIG. 2. Emissive display 300 may include any or all of the optional protective layers described in FIG. 2, which are not shown again in FIG. 3 for simplicity of illustration.

Figure 4:
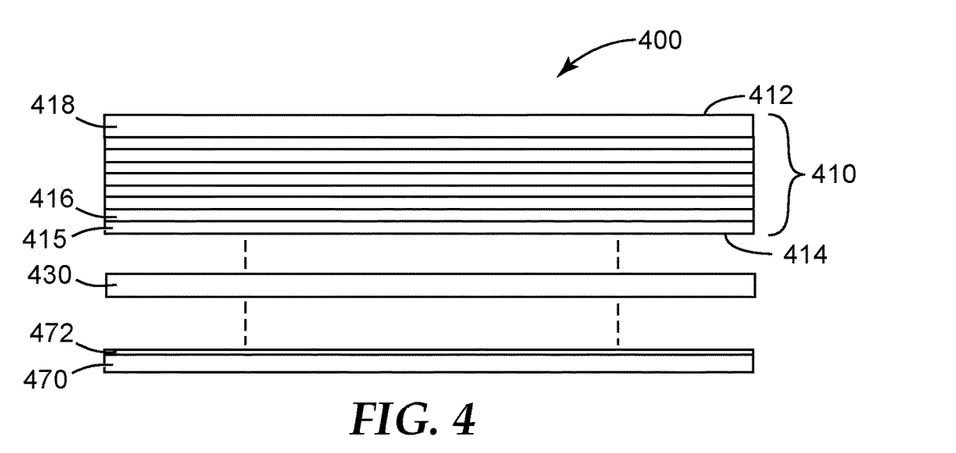
FIG. 4 is a cross section of an optical stack further including a liner with adhesive.

FIG. 4 is a cross section of an optical stack further including a liner with adhesive. Optical stack 400 includes optical core 410 with top surface 412 and bottom surface 414 and having alternating layers 415 and 416 and skin layer 418. Quarter-wave plate 430 is disposed directly on bottom surface 414. Liner 470 is attached to the bottom surface of the rest of the optical stack via adhesive 472.

Optical stack 400 may be formed through a continuous roll-to-roll process. In a roll of film including optical stack 400, certain protection for the components of the optical stack may be needed during winding, handling, unwinding, and possibly converting.

Liner 470 may be any suitable liner, and may be selected for its physical characteristics. For example, liner 470 may prevent damage to quarter-wave plate 430 by scratching or rubbing, or it may protect the accumulation of dirt, dust, or other debris within the optical stack. In some embodiments, liner 470 may be selected for its optical properties. For example, liner 470 may absorb UV light that may be damaging to the rest of optical stack 400. Liner 470 is shown on only the bottom side of optical stack 400, but in some embodiments, liner 470 is on both sides. In some embodiments, only one side is needed as the liner is intended as protection as optical stack 400 is rolled on itself. Liner 470 is not typically intended to remain on optical stack 400 in its final display application. For that reason, liner 470 may be selected to have appropriate structural integrity or tear resistance, such that the entirety of liner 470 can be removed, either on an individual converted piece or as part of a continuous process.

Adhesive 472 may be any suitable adhesive and may be chosen for its suitability as a cleanly removable adhesive. Adhesive 472 may be or include a pressure sensitive adhesive. In some embodiments, adhesive 472 may be a stretch releasable adhesive. In some embodiments, adhesive 472 may be a repositionable adhesive.

EXAMPLES

Example 1

An integrated absorbing-reflective polarizer was prepared as follows. A single multilayer optical packet was coextruded as described in US 2011/0102891 ("Low Layer Count Reflective Polarizer with Optimized Gain") with the following exceptions. The first optical layers were comprised of a blend of polyethylene naphthalate (PEN) homopolymer (100 mol % naphthalene dicarboxylate with 100 mol % ethylene glycol) having a Tg of 121-123 degrees centigrade and four different dichroic co-extrudable absorbing dyes (PD-325H, PD-335H, PD-104 and PD-318H; all available from Mitsui Fine Chemicals, Tokyo Japan), as described in WO 2014/130283. The dye weight percentages were as follows: PD-325H=1.67 wt %, PD-335H=0.21 wt %, PD-104=0.67 wt %, and PD-318H=1.25 wt %. The second polymer (second optical layers) was a blend of polycarbonate and copolyesters (PC: coPET) such that the index was about 1.57 and remained substantially isotropic upon uniaxial orientation. The PC: coPET molar ratio was approximately 42.5 mol % PC and 57.5 mol % coPET and had a Tg of 105 degrees centigrade. The polymer used for the layer opposite the casting wheel was a blend of 90/10 coPEN, a polymer composed of 90% polyethylene naphthalate (PEN) and 10% polyethylene terephthalate (PET). The polymer used for the layer facing the casting wheel was a blend of polyethylene naphthalate (PEN) homopolymer (100 mol % naphthalene dicarboxylate with 100 mol % ethylene glycol) having a Tg of 121-123 degrees centigrade and four different dichroic co-extrudable absorbing dyes (PD-325H, PD-335H, PD-104 and PD-318H), as previously described. The dye weight percentages utilized for the layer facing the casting wheel were as follows: PD-325H=0.93 wt %, PD-335H=0.35 wt %, PD-104=0.56 wt %, and PD-318H=0.41 wt %.

The materials were fed from separate extruders to a multilayer coextrusion feedblock, in which they were assembled into a packet of 305 alternating optical layers. The skin layers of the first optical layer material were added to the construction in a manifold specific to that purpose, resulting in a final construction having 307 layers. The multilayer melt was then cast through a film die onto a chill roll, in the conventional manner for polyester films, and quenched. The cast web was then stretched in a commercial scale linear tenter at temperatures and draw profiles similar to those described in Example 2 of US 2007/0047080. The film thickness, measured with a capacitance gauge, was approximately 43 micrometers.

Figure 5:
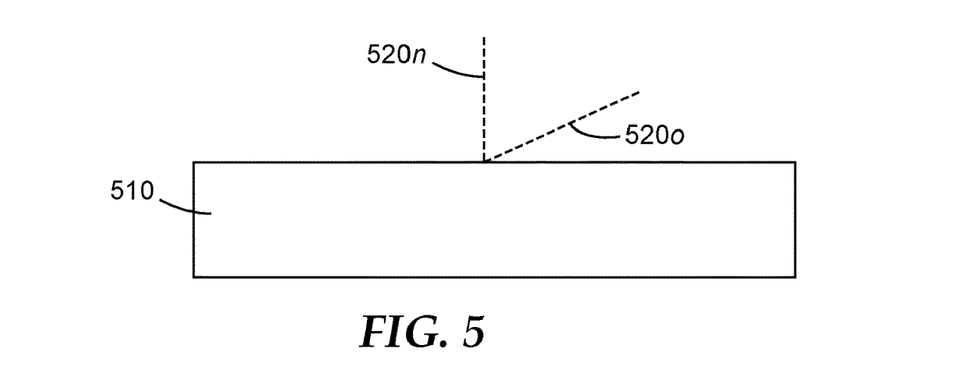
FIG. 5 is a diagram illustrating several exemplary measurement angles for a display.

Next a circular polarizer (CP) was made utilizing the integrated polarizer. Materials were solvent coated and UV cured on the integrated polarizer with the slow optical axis oriented at 45 degrees relative to the pass direction of the integrated polarizer. The coated layer had a retardation of 138 nm at a wavelength of 550 nm. (Retardation is defined by $Re=(ni-nj)*d$, where $ni-nj$ is the in-plane birefringence difference between the slow and fast optical axis of the coated material and d is the thickness of the coated layer.) The coating materials utilized were materials similar to those described in US2002/0180916, US2003/028048 and US2005/0072959 where the linear photopolymerizable polymer (LPP) material was ROP-131 EXP 306 LPP and the liquid crystal polymer (LCP) material was ROF-5185 EXP 410 LCP (both available from Rolic Technologies, Allschwil, Switzerland). The corresponding integrated CP had a thickness of about 44 μm. The integrated CP was then laminated with optically clear pressure sensitive adhesive (OCA) to an OLED display (SAMSUNG GALAXY S 5, available from Samsung Electronics, Suwon, South Korea, and LG G FLEX, available from LG Corp., Seoul, South Korea) where its color performance was measured with an Eldim L80 Spectraradiometer (available from Eldim, Herouville-Saint-Clair, France). To determine color change as a function of viewing angle in display 510, color measurements were taken on-axis 520$n$ (normal incidence) and at 60 degrees off-axis 520$o$ (oblique incidence) relative to the display normal, as shown in FIG. 5. Measurements were taken at various points from 0 to 135 degrees azimuthally, at 45 degree increments, and averaged.

The brightness and reflectivity were also measured for the integrated-CP. These are shown in Table 2. Brightness was measured via PR-650 Spectrophotometer (available from Photo Research Inc., Chatsworth Calif.) and reflectivity was measured via Lambda 900 Spectrometer (available from Perkin Elmer, Waltham Mass.). To measure the brightness, the OLED device with integrated-CP made as described above was laminated using OCA to a white screen and the PR-650 was adjusted until the picture was focused on the pixels of the OLED device. The PR-650 then measured the brightness in $Cd/m^2$. For reflectivity measurements, the first step was to auto-zero the equipment using a reference mirror standard; the mirror was placed facing the port opening of the Lambda spectrometer and the percent reflectance was measured. After the auto-zero was complete, the OLED device with integrated-CP was laminated, using OCA, to the encapsulation glass, placed facing the port opening and the percent reflectance was measured and normalized to the standard mirror. The OLED-CP thickness values were obtained by SEM cross-section of the SAMSUNG and LG devices as received.

TABLE 2

Brightness, Reflectivity, Average change in color coordinates u',v' and thickness (in micrometers) for OLED-CP's.

| Sample | OLED-CP Thickness (μm) | Brightness (cd/m²) | Reflectivity (% T) | Avg Δu'v' (60 deg) | % color change |
|---|---|---|---|---|---|
| SAMSUNG GALAXY S 5 | | | | | |
| Samsung Galaxy S5 - as received | 175 | 337.9 | 5.59 | 0.0176 | 0 |
| Comparative Example 1 | 320 | 326.5 | 5.94 | 0.0122 | 30.7 |
| Comparative Example 2 | 360 | 484.9 | 15.63 | 0.0103 | 41.5 |
| Example 1 | 44 | 194.7 | 11.31 | 0.0142 | 20 |
| Example 2 | 154 | 200.3 | 11.02 | 0.0148 | 16 |
| Example 3 | 48 | 245.2 | 7.29 | 0.0091 | 48.3 |
| Example 4 | 165 | 248.3 | 6.61 | 0.0089 | 49.4 |
| Example 5 | 47 | 244.9 | 12.66 | 0.0115 | 34.7 |
| Example 6 | 170 | 245.6 | 11.80 | 0.0084 | 52.3 |
| Example 7 | 45 | 288.5 | 8.54 | 0.0083 | 52.8 |
| Example 8 | 171 | 279.8 | 8.50 | 0.0068 | 61.4 |
| LG G FLEX | | | | | |
| LG Flex - as received | 210-278* | 297.5 | 6.36 | 0.0379 | 0 |
| Comparative Example 1 | 320 | 288.4 | 6.26 | 0.0264 | 30.3 |
| Comparative Example 2 | 360 | 458.4 | 20.10 | 0.0230 | 39.3 |
| Example 1 | 44 | 177.3 | 11.45 | 0.0242 | 36.1 |
| Example 2 | 154 | 173.3 | 11.26 | 0.0179 | 52.8 |
| Example 3 | 48 | 219.5 | 7.60 | 0.0268 | 29.3 |
| Example 4 | 165 | 222.1 | 7.96 | 0.0268 | 29.2 |
| Example 5 | 47 | 221.8 | 16.22 | 0.0210 | 44.6 |
| Example 6 | 170 | 223.5 | 13.25 | 0.0247 | 34.8 |
| Example 7 | 45 | 257.4 | 8.25 | 0.0257 | 32.1 |
| Example 8 | 171 | 248.5 | 8.34 | 0.0288 | 24.0 |

*LG G FLEX OLED-CP possessed additional potentially non-optically functioning layers that may be OCA

Example 2

The integrated absorbing-reflective polarizer of Example 1 was used to make a circular polarizer. The integrated polarizer film was laminated with an optically clear pressure sensitive adhesive (OCA) to a quarter wave plate (QWP) with trade name APQW92-004-MT (available from American Polarizers, Inc., Reading, Pa.). The QWP optical axis was approximately 45 degrees relative to the optic axis of the integrated polarizer. The thickness of the QWP was 110 µm. The integrated-CP was then laminated with optically clear pressure sensitive adhesive (OCA) to the OLED displays where its brightness, reflectivity, color performance, and thickness were measured as previously discussed and reported in Table 2.

Example 3

The birefringent integrated absorbing-reflective polarizer was prepared the as in Example 1 except that the cast web was then stretched in a parabolic tenter using an unconstrained uniaxial stretch so that the film is allowed to] contact or relax substantially equally in the y and z directions while being stretched in the x direction. The temperatures and draw ratios used were similar to those described in Example 2 of U.S. Patent Publication 2007/0047080. The transverse direction (TD) draw ratio was measured to be 6.0× while the downweb or machine direction (MD) draw ratio was measured to be 0.48×.

To create a circular polarizer utilizing the integrated polarizer, materials were solvent coated and UV cured on the integrated polarizer similar to that in Example 1. The corresponding Integrated CP had a thickness of about 47 micrometers+1 micrometer for a total of 48 micrometers. The integrated CP was then measured for brightness, color performance and reflectivity as in previous examples. The results are shown in Table 2.

Example 4

The integrated polarizer film of Example 3 was laminated with the same QWP as in Example 2 to create the integrated-CP. The integrated CP was then measured for brightness, color performance and reflectivity as in previous examples. The results are shown in Table 2.

Example 5

A birefringent integrated absorbing-reflective polarizer was prepared as in Example 1 with the following exception. The first optical layers were comprised of a blend of 90/10 coPEN, a polymer composed of 90% polyethylene naphthalate (PEN) and 10% polyethylene terephthalate (PET), and four different dichroic co-extrudable absorbing dyes (PD-325H, PD-335H, PD-104 and PD-318H), as previously described. The dye weight percentages utilized in Example 5 were: PD-325H=0.93 wt %, PD-335H=0.12 wt %, PD-104=0.37 wt %, and PD-318H=0.69 wt %. The dye utilized within the first optical layers was approximately half of that used in Examples 1-4. The integrated CP was then measured for brightness, color performance and reflectivity as in previous examples. The results are shown in Table 2.

Example 6

The integrated polarizer film of Example 5 was laminated with the same QWP as in Example 2 to create the integrated-CP. The integrated CP was then measured for brightness, color performance and reflectivity as in previous examples. The results are shown in Table 2.

Example 7

A birefringent integrated absorbing-reflective polarizer was prepared as in Example 5 except that the cast web was then stretched similar to that in Example 3 but at a TD ratio of 6.0× and MD ratio of 0.46×. The integrated CP was then measured for brightness, color performance and reflectivity as in previous examples. The results are shown in Table 2.

Example 8

The integrated polarizer film of Example 7 was laminated with the same QWP as in Example 2 to create the integrated-CP. The integrated CP was then measured for brightness, color performance and reflectivity as in previous examples. The results are shown in Table 2.

Comparative Example 1

A two layer optical stack consisting of SanRitz 5618 H-Type polarizer (available from Sanritz America, Chula Vista Calif.), and the quarter wave film described in Example 2 was laminated at 45 degrees to the pass axis of the Sanritz polarizer. The three films were laminated together using a 25 micrometer thick 8171 optically clear adhesive (available from 3M Co., St. Paul Minn.). The film stack was measured as previously described for OLED performance and thickness. The results are shown in Table 2.

Comparative Example 2

A three layer optical stack was made. It consisted of APF-V3 absorbing polarizer (available from 3M Co.), Sanritz 5618 H-Type polarizer, and the quarter wave film of Example 2. The quarter wave plate was laminated at 45 degrees to the pass axis of APF-V3 and the Sanritz polarizer. The pass directions of the APF-V3 and Sanritz polarizers were aligned. The 8171 optically clear adhesive, 25 micrometers thick, was again used to laminate the three films together. The film stack was measured as previously described for OLED performance and thickness. The results are shown in Table 2.

The values presented in Table 2 for Examples 1-8 are considered generally acceptable in terms of display performance attributes for an OLED device.

The following are exemplary embodiments according to the present disclosure:

Item 1. An optical stack, comprising:
 an optical core having a top surface and a bottom surface, the optical core including a reflecting-absorbing polarizer having at least one skin layer positioned nearer the top surface than the bottom surface, the at least one skin layer including polarizing dye; and
 a quarter-wave plate disposed directly on the bottom surface of the optical core;
 wherein the optical stack contains no polarization-selecting elements outside of the optical core.

Item 2. The optical stack of item 1, wherein all of the optical core has been stretched together.

Item 3. The optical stack of item 1, wherein all the optical core has been coextruded.

Item 4. The optical stack of item 1, wherein the reflecting-absorbing polarizer includes a second skin layer positioned nearer the bottom surface than the top surface.

Item 5. The optical stack of item 1, wherein the optical stack includes a diffuse reflective polarizing layer positioned nearer the bottom surface than the top surface.

Item 6. The optical stack of item 5, wherein the diffuse reflective polarizing layer includes a first polymer and a second polymer, and the first polymer and the second polymer are immiscible.

Item 7. The optical stack of item 6, wherein at least one of the first polymer and the second polymer is a birefringent polymer.

Item 8. The optical stack of item 1, wherein the optical stack further comprises at least one protective layer, but not in the optical core.

Item 9. The optical stack of item 8, wherein the at least one protective layer includes a diffusing surface structure.

Item 10. The optical stack of item 8, wherein the at least one protective layer includes a bulk diffuser.

Item 11. The optical stack of item 1, wherein the optical stack further comprises at least two protective layers, but not in the optical core.

Item 12. The optical stack of item 1, wherein the optical core together with the quarter-wave plate has a total thickness of no more than 100 micrometers.

Item 13. The optical stack of item 1, wherein the optical stack has a total thickness of no more than 100 micrometers.

Item 14. An emissive display comprising at least one light source and the optical stack of item 1, wherein the optical stack is disposed such that the bottom surface of the optical core is positioned nearer the at least one light source than the top surface.

Item 15. The optical stack of item 1, further comprising a layer of optically clear adhesive and a liner, wherein the optically clear adhesive is disposed between the liner and the rest of the optical stack.

Item 16. A roll of film, comprising the optical stack of item 15.

Item 17. The optical stack of item 1, further comprising a bulk diffuser disposed on the top surface of the optical core.

Item 18. The optical stack of item 1, further comprising a surface diffuser disposed on the top surface of the optical core.

Item 19. The optical stack of item 1, wherein the reflecting-absorbing polarizer comprises a plurality of alternating first and second polymer layers, wherein the first polymer layer has a higher index of refraction than the second polymer layer and the first polymer layer includes polarizing dye.

Item 20. The optical stack of item 1, wherein the reflecting-absorbing polarizer comprises:
  a reflective polarizer portion comprising a plurality of alternating first and second polymer layers, wherein each of the alternating first and second polymer layers is substantially free of polarizing dye; and
  a hybrid polarizer portion comprising a plurality of alternating third and fourth polymer layers;
  wherein the third polymer layer has a higher index of refraction than the fourth layer;
  wherein the third polymer layer includes polarizing dye; and
  wherein the reflective polarizer portion and the hybrid polarizer portion are disposed adjacent to one another.

Descriptions for elements in figures should be understood to apply equally to corresponding elements in other figures, unless indicated otherwise. The present invention should not be considered limited to the particular examples and embodiments described above, as such embodiments are described in detail in order to facilitate explanation of various aspects of the invention. Rather, the present invention should be understood to cover all aspects of the invention, including various modifications, equivalent processes, and alternative devices falling within the scope of the invention as defined by the appended claims and their equivalents.

What is claimed is:

1. An optical stack, comprising:
  an optical core having a top surface and a bottom surface, the optical core including a reflecting-absorbing polarizer having a hybrid polarizer portion with alternating layers of high index layers and low index layers and at least one skin layer thicker than any of the alternating high index layers or low index layers positioned nearer the top surface than the bottom surface, the at least one skin layer and at least some of the high index layers including polarizing dye; and
  a quarter-wave plate disposed directly on the bottom surface of the optical core;
  wherein the optical stack contains no polarization-selecting elements outside of the optical core, and
  wherein the optical stack includes a diffuse reflective polarizing layer positioned nearer the bottom surface than the top surface.

2. The optical stack of claim 1, wherein all of the optical core has been stretched together.

3. The optical stack of claim 1, wherein all the optical core has been coextruded.

4. The optical stack of claim 1, wherein the reflecting-absorbing polarizer includes a second skin layer positioned nearer the bottom surface than the top surface.

5. The optical stack of claim 1, wherein the diffuse reflective polarizing layer includes a first polymer and a second polymer, and the first polymer and the second polymer are immiscible.

6. The optical stack of claim 5, wherein at least one of the first polymer and the second polymer is a birefringent polymer.

7. The optical stack of claim 1, wherein the optical stack further comprises at least one protective layer, but not in the optical core.

8. The optical stack of claim 7, wherein the at least one protective layer includes a diffusing surface structure.

9. The optical stack of claim 7, wherein the at least one protective layer includes a bulk diffuser.

10. The optical stack of claim 1, wherein the optical stack further comprises at least two protective layers, but not in the optical core.

11. The optical stack of claim 1, wherein the optical core together with the quarter-wave plate has a total thickness of no more than 100 micrometers.

12. The optical stack of claim 1, wherein the optical stack has a total thickness of no more than 100 micrometers.

13. An emissive display comprising at least one light source and the optical stack of claim 1, wherein the optical stack is disposed such that the bottom surface of the optical core is positioned nearer the at least one light source than the top surface.

14. The optical stack of claim 1, further comprising a layer of optically clear adhesive and a liner, wherein the optically clear adhesive is disposed between the liner and the rest of the optical stack.

15. A roll of film, comprising the optical stack of claim 14.

16. The optical stack of claim 1, further comprising a bulk diffuser disposed on the top surface of the optical core.

17. The optical stack of claim 1, further comprising a surface diffuser disposed on the top surface of the optical core.

18. The optical stack of claim 1, wherein the reflecting-absorbing polarizer comprises a plurality of alternating first and second polymer layers, wherein the first polymer layer has a higher index of refraction than the second polymer layer and the first polymer layer includes polarizing dye.

19. The optical stack of claim 1, wherein the reflecting-absorbing polarizer comprises:
 a reflective polarizer portion comprising a plurality of alternating first and second polymer layers, wherein each of the alternating first and second polymer layers is substantially free of polarizing dye; and
 a hybrid polarizer portion comprising a plurality of alternating third and fourth polymer layers;
 wherein the third polymer layer has a higher index of refraction than the fourth layer;
 wherein the third polymer layer includes polarizing dye; and
 wherein the reflective polarizer portion and the hybrid polarizer portion are disposed adjacent to one another.

* * * * *

UNITED STATES PATENT AND TRADEMARK OFFICE
CERTIFICATE OF CORRECTION

PATENT NO.         : 10,466,398 B2                              Page 1 of 1
APPLICATION NO.    : 15/737043
DATED              : November 5, 2019
INVENTOR(S)        : Matthew Johnson It is certified that error appears in the above-identified patent and that said Letters Patent is hereby corrected as shown below:

In the Specification

<u>Column 4</u>
Line 42, delete "50," and insert -- 5°, --
Line 42, delete "10" and insert -- 1° --

Signed and Sealed this
Fifth Day of May, 2020

Andrei Iancu
*Director of the United States Patent and Trademark Office*